US008897015B2

(12) United States Patent
Feller et al.

(10) Patent No.: US 8,897,015 B2
(45) Date of Patent: Nov. 25, 2014

(54) BASE PLATE

(75) Inventors: Lydia Feller, Zürich (CH); Samuel Hartmann, Staufen (CH)

(73) Assignee: ABB Technology AG, Zurich (CH)

( * ) Notice: Subject to any disclaimer, the term of this patent is extended or adjusted under 35 U.S.C. 154(b) by 179 days.

(21) Appl. No.: 13/287,428

(22) Filed: Nov. 2, 2011

(65) Prior Publication Data

US 2012/0106087 A1 May 3, 2012

(30) Foreign Application Priority Data

Nov. 2, 2010 (EP) .................................... 10189684

(51) Int. Cl.
| H05K 7/20 | (2006.01) |
| H05K 1/02 | (2006.01) |
| H01L 23/13 | (2006.01) |
| H01L 23/538 | (2006.01) |
| H01L 25/07 | (2006.01) |
| H01L 23/00 | (2006.01) |

(52) U.S. Cl.
CPC ......... H01L 23/13 (2013.01); *H01L 2224/4903* (2013.01); *H01L 224/32225* (2013.01); H05K 1/0271 (2013.01); *H01L 2224/48227* (2013.01); *H01L 2224/48091* (2013.01); H01L 23/5387 (2013.01); *H01L 2924/13055* (2013.01); *H01L 24/49* (2013.01); H01L 25/072 (2013.01); *H01L 2224/48137* (2013.01); *H01L 2924/13091* (2013.01); *H01L 2224/73265* (2013.01); *H01L 2924/12041* (2013.01)
USPC ........... 361/717; 361/718; 361/719; 361/707; 165/80.3

(58) Field of Classification Search
None
See application file for complete search history.

(56) References Cited

U.S. PATENT DOCUMENTS

| 5,355,280 | A  | * | 10/1994 | Rothlingshofer et al. | ..... 361/705 |
| 6,301,115 | B1 | * | 10/2001 | Hashimoto et al. | ........... 361/704 |
| 6,563,211 | B2 | * | 5/2003 | Fukada et al. | ................ 257/706 |
| 6,870,738 | B2 | * | 3/2005 | Goebl | ............................ 361/719 |
| 7,511,961 | B2 | * | 3/2009 | Tschirbs et al. | .............. 361/704 |
| 7,606,038 | B2 | * | 10/2009 | Sugimura | ..................... 361/720 |
| 7,663,886 | B2 | * | 2/2010 | Aoki et al. | .................... 361/715 |
| 7,948,758 | B2 | * | 5/2011 | Buhler et al. | ................. 361/702 |
| 7,993,728 | B2 | * | 8/2011 | Hirotsuru et al. | ............ 428/158 |
| 8,050,054 | B2 | * | 11/2011 | Chen et al. | .................... 361/804 |
| 8,072,760 | B2 | * | 12/2011 | Matsuo et al. | ................ 361/707 |
| 8,237,260 | B2 | * | 8/2012 | Tschirbs | ....................... 257/700 |
| 2006/0035069 | A1 | | 2/2006 | Hanai | |

(Continued)

FOREIGN PATENT DOCUMENTS

| DE | 19707514 A1 | 8/1998 |
| EP | 1973157 A1 | 9/2008 |

(Continued)

OTHER PUBLICATIONS

European Search Report issued on Apr. 6, 2011 for European Application No. 10189684.3.

(Continued)

*Primary Examiner* — Boris Chervinsky
(74) *Attorney, Agent, or Firm* — Buchanan Ingersoll & Rooney PC

(57) ABSTRACT

The present disclosure relates to a base plate, for example, for a power module, including a matrix formed of metal, for example, aluminum, wherein at least two reinforcements are provided in the matrix next to each other, and wherein the reinforcements are spaced apart from each other.

20 Claims, 3 Drawing Sheets

(56) References Cited

U.S. PATENT DOCUMENTS

2007/0165376 A1* 7/2007 Bones et al. .................. 361/688
2009/0092793 A1   4/2009 Hirotsuru et al.
2009/0280351 A1   11/2009 Hirotsuru et al.
2010/0134979 A1* 6/2010 Obiraki et al. ................ 361/709

FOREIGN PATENT DOCUMENTS

| | | |
|---|---|---|
| EP | 2012354 A1 | 1/2009 |
| JP | 2003-204022 A | 7/2003 |
| WO | WO 01/08219 A1 | 2/2001 |

OTHER PUBLICATIONS

Ayumi Maruta et al., 2500A/1200V Dual IGBT Module, Proceedings PCIM Europe 2009 Conference, pp. 414-419.

* cited by examiner

BASE PLATE

RELATED APPLICATION(S)

This application claims priority under 35 U.S.C. §119 to European Patent Application No. 10189684 filed in Europe on Nov. 2, 2010, the entire content of which is hereby incorporated by reference in its entirety.

FIELD

The disclosure relates to a base plate, for example, for a power module.

BACKGROUND INFORMATION

Thermal management is an issue for packaging, for example, power modules, and high power semiconductors, because use of power devices can lead to losses which generate heat. Heat generated at dies can be extracted through a heat sink. The modules can be mounted on the heat sink and heat can flow through an internal structure of the module through a base plate to the heat sink. The base plate can be a contributor to thermal resistance. Therefore, optimization and reduction of the heat resistance of the base plate can have an impact on the thermal management and the reliability and lifetime of, for example, a power module and a high power semiconductor.

EP 2 012 354 A1 discloses a base plate for a power module including an aluminium silicon carbide composite and aluminium layers made of a metal containing aluminium as the main component formed on respective principal planes of the aluminium silicon carbide composite. In order to reduce a gap between the base plate and a heat-dissipation fin, or heat sink, respectively, the base plate is formed to have a convex bow.

EP 1 973 157 A1 discloses a base plate for a power module including an aluminium silicon carbide composite that is a flat plate-shaped silicon carbide porous body impregnated with a metal containing aluminium as the main component, and an aluminium layer made of a metal containing aluminium as the main component formed only on one of the principal planes of the aluminium silicon carbide composite. The base plate is formed to have a convex bow in order to reduce a gap between the base plate and a heat-dissipation fin, or heat sink, respectively.

These base plates have limited ability to be adapted to topography, or roughness, respectively, of a surface of the heat sink. This can lead to formation of voluminous cavities between the base plate and the surface of the heat sink, thereby reducing heat-dissipation properties. These base plates can be secured to the internal structure of the power module as well as to the heat sink with internal tension in order to get sufficient heat-dissipation properties. Consequently, there can be a risk of the base plate to crack.

Proceedings PCIM Europe 2009 Conference, Ayumi Maruta, Mitsuharu Tabata, 2500 A/1200V Dual IGBT Module, discloses a layout of a power module which includes a cooling fin on which a plurality of separated base plates, or base plate sections, respectively, are arranged.

Where a base plate is joined with a heat sink, a heat dissipation grease, gel, or mat, having high thermal conductivity can be applied to portions to be joined. The base plate can be fixed to the heat sink, or a heat-dissipation unit, respectively by screws through holes provided in a peripheral portion of the base plate. In the layout described above, the formation of gaps between the respective base plates may not be completely avoided. These gap-formations can lead to a leakage of the grease through the gaps. The materials, such as low molecular weight molecules of the gel, other particles, or the like can diffuse from the inside of the module to the outside. A loss of grease can reduce heat dissipation from the base plate to the heat sink.

SUMMARY

A base plate for a power module is disclosed, which includes a matrix formed of metal; and at least two reinforcements provided in the matrix adjacent to each other, wherein the reinforcements are spaced apart from each other.

BRIEF DESCRIPTION OF DRAWINGS

The disclosure, further embodiments and further advantages will be described in greater detail on the basis of the exemplary embodiments illustrated in the drawings, wherein.

DETAILED DESCRIPTION

Figure 1:
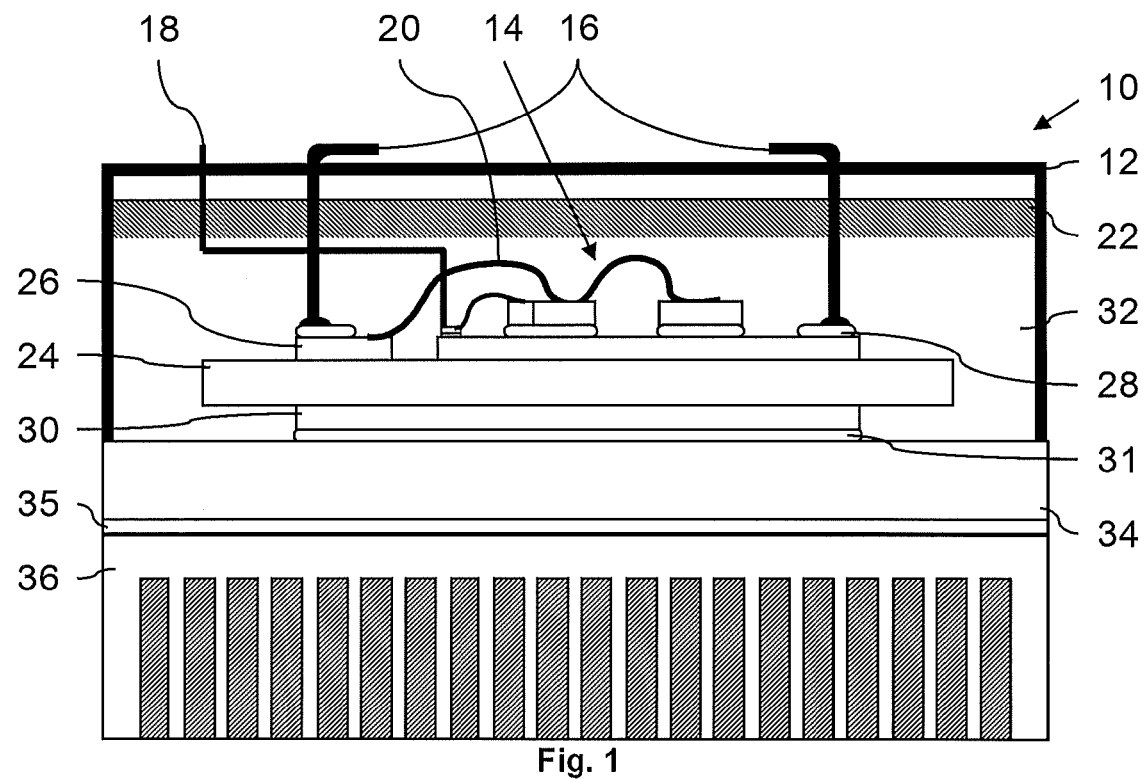
FIG. 1 shows a sectional side view of an arrangement of a power module.

A base plate according to an exemplary embodiment of the disclosure can be suitable for a power module. It can include a matrix formed of metal, for example, aluminium, wherein at least two reinforcements are provided in the matrix next to each other, and wherein the reinforcements are spaced apart from each other.

A base plate according to an exemplary embodiment of the disclosure can have at least two independent and separated reinforcements which can act as a heat spreader to extract heat from the power module, or the internal structure of the power module, to the heat sink. The separated reinforcements are arranged in the matrix and can form inserts which can be fully embedded in the matrix.

The reinforcements can be stiffer compared to the matrix, which in turn can be more ductile compared to the reinforcements. The stability can be provided by the reinforcements. The matrix can be formed of a more flexible material. The more ductile matrix material completely surrounds the stiff reinforcements and holds the reinforcements together.

Due to the discontinuous structure of the reinforcements having a relatively large structural strength, the base plate as a whole can be flexible within certain limits, for example, at the gaps between the reinforcements. This effect can be distinct, if the matrix is formed of a ductile metal, for example, aluminium. In this regard, according to the disclosure, a matrix formed of aluminium means that the matrix can be formed of for example, substantially pure aluminium or a metal having aluminium as a main constituent.

A base plate according to exemplary embodiments of the disclosure can thus be adapted to a geometry and topography of a surface of the heat sink as the reinforcements can react independent to each other. This adaption can lead to a relatively close contact between the surface of the heat sink and the base plate despite a potentially rough surface, or undesired unevenness, of the heat sink. This close contact can lead to a prevention of voluminous thermally insulating cavities between the surface of the heat sink and the base plate and thus to improved heat transfer. The heat dissipation properties of a power module including a base plate according to exemplary embodiments of the disclosure can be consequently improved.

Due to the provision of independent and separated reinforcements, the internal stress in the base plate can be strongly reduced leading to a much lower risk of cracking and thus of damaging the base plate. The durability, or lifetime, respectively, of the base plate can be improved. The stress inside the power module can be reduced. For example, there is provided less substrate bending during mounting of the power module.

Due to the discontinuous and separated reinforcements being arranged in the continuous and more ductile matrix material, the heat sink as a whole is covered by the base plate. Consequently, a leakage of heat dissipation grease, for example, due to an elevated temperature, can be avoided. As such a leakage can lead to reduced heat-dissipation properties, the durability of the heat dissipation properties can be improved. Additionally, contamination can be avoided.

The reinforcements as well as the surrounding material, for example, the matrix, can be formed in a plate-shaped manner. According to the disclosure, the expression "plate-shaped" can be that the width and/or length are bigger with respect to the height. This can enable the base plate to be introduced and used in a power module, thereby enabling good heat dissipation properties.

In an exemplary embodiment of the disclosure, a plurality of through holes for securing the base plate to a heat sink can be provided in the matrix along a length as well as along a width of the base plate, wherein no reinforcement is provided between the through holes along the width of the base plate. For example, along the length of the base plate, more than two through holes can be provided, whereas along the width two through holes can be sufficient. This can enable an improved flexibility of the base plate and can reduce stress. In a region of the matrix, the material can be ductile and can enable a secure fixation of the base plate to the heat sink, for example.

Along the width, or along the length refers to the through holes being provided substantially in one line extending in the direction of the width, or the length, respectively. The width can refer to the shorter side of the base plate, and the length can refer to the longer side of the latter.

In an exemplary embodiment of the disclosure, the at least two reinforcements can be formed from silicon carbide (SiC). This is a ceramic reinforcement which has a high mechanical strength leading to a good stability of the composites. Furthermore, silicon carbide ceramics do not change their shape, bulk, or properties. Aluminium, for example, also has good stability properties with respect to durability and thermal stability, especially in combination with a matrix being formed of aluminium, no plastic deformation and no internal cracking of the mounted base plate may occur.

Silicon carbide also exhibits high thermal conductivity, which lies in the exemplary range of more than 180 W/mK, for example, in the exemplary range of about 180 W/mK-200 W/mK. Therefore, this material and thus the base plate according to the disclosure can have very good heat extraction properties. However, each material combination which is appropriate can be used.

According to an exemplary embodiment of the disclosure, the reinforcements can be arranged with a distance from each other in the exemplary range of about 1 mm to 5 mm, for example, 3 mm. This arrangement can allow a good covering of the heat sink with the reinforcements thereby allowing the reinforcements acting independently from each other and the base plate to be flexible. This can enable a close contact of the base plate to the surface of the heat sink.

According to an exemplary embodiment of the disclosure, the base plate can be at least partly formed as a bow. This can enable a gap, which is potentially present between the surface of the heat sink and the base plate, being reduced. Accordingly, in this embodiment, the contact of the base plate to the surface of the heat sink can be improved. Due to the provision of independent and separated reinforcements, the base plate according to the disclosure can be enabled to sustain bending stress.

An exemplary geometry of the bow can be defined by the maximum bow deflection height which can, for example, be about (e.g., ±10%) 100 µm±50 µm. Such a bow can have improved properties with respect to a contact between the heat sink and the base plate.

Due to the fact that the reinforcements which are embedded in the matrix are separated from each other, a bow may be formed only over the width of the base plate. The formation of a bow over the full length of the base plate is not necessary. It can be reduced to only a half or a third of the base plate. In an exemplary embodiment, a bow over the length of the base plate can be avoided. This can lead to only one curvature having to be pressed, or formed, respectively. The base plate can thus be produced with a higher reproducibility and in a less complex manner.

According to an exemplary embodiment of the disclosure, all reinforcements together can have dimensions of at least 70% with respect to the dimension of the base plate, for example, at least 85% with respect to the dimension of the base plate. This can lead to sufficiently high heat extraction properties which can be affected by the reinforcements. However, the flexibility of the base plate can be sufficient enough to obtain an excellent adaption of the base plate to the surface of the heat sink. Additionally, due to the structural strength of the reinforcements, stable bows can be formed which maintain their structure even after spanning the base plate to the heat sink of the internal structure of the power module. The dimension thereby corresponds to the surface of all reinforcements with respect to the surface of the matrix, or the base plate as such, respectively.

According to an exemplary embodiment of the disclosure, the matrix can be formed as a metal layer formed on and between the reinforcements. In this embodiment, the base plate according to the disclosure can be produced in a relatively easy manner leading to cost savings as well as time savings during the formation.

In this regard, the reinforcements can be fully covered by the metal layer. This can enable the base plate according to the disclosure to have an enhanced structural stability. Furthermore, especially if a ductile metal is used for forming the matrix, the contact between the base plate and the cooling fin can be further improved.

According to an exemplary embodiment of the present disclosure, the maxim value of the coefficient of thermal expansion (CTE) of the base plate lies in an exemplary range of about 8 ppm/k-12 ppm/k, for example, at 10 ppm/k. This can enable the base plate to match the coefficient of thermal expansion of the internal components of the power module. Thermal stresses can thus be minimized which improves the durability of the power module.

In FIG. 1, an exemplary arrangement of a power module 10 is schematically shown. In detail, the internal structure of the power module 10 is described. The power module 10 includes a housing 12 in which at least one power semiconductor device 14 can be arranged. The semiconductor device 14 can be, for example, an insulated gate bipolar transistor (IGBT), a diode, a metal oxide semiconductor field-effect transistor (MOSFET), or the like. According to FIG. 1, a diode and an IGBT are provided. The semiconductor device 14 or the plurality of semiconductor devices 14 can be connectable via terminals 16 and via an auxiliary terminal 18, wherein the semiconductor device 14 can be bonded by aluminium bond wires 20.

As an insulator, a layer of epoxy 22 can be arranged above the semiconductor device 14. The semiconductor device 14 can be arranged on a substrate 24, which can be formed as an aluminium nitride ceramic insulator. The terminals 16 as well as the auxiliary terminal 18 can be connected to the substrate 24 via a metallization 26, such as a copper metallization, and a solder 28, or lot, respectively. However, comparable connections, such as ultrasonic welding, can be applied. Additionally, the substrate 24 is connected to a further metallization 30, such as a copper metallization, at its bottom side. The remaining volume inside the housing 12 is filled for example, with an insulating gel 32.

During operation, a power module 10 can generate thermal energy, or heat, respectively, due to the resistances in the electric conductors. Consequently, the generated heat has to be dissipated from internal of the power module 10 to its outside. For this purpose, the power module 10 includes a base plate 34. The base plate 34 is in thermal contact to the semiconductor device 14 on its upper side via the metallization 30 and a solder 31, and is furthermore thermally connected to a cooling fin, or heat sink 36, respectively. Between the base plate 34 and the heat sink 36, a heat conducting layer 35, such as a heat dissipation grease, gel, or mat, can be provided.

The heat sink 36 can be formed of a material with high thermal conductivity and can allow dissipating the thermal energy, or the heat, respectively, from the inside of the power module 10 to the environment. Thus, the heat flows from the internal structure of the power module 10 through the base plate 34 and the heat sink 36 to the outside of the power module 10 in order to secure the power module 10 to work properly.

Figure 2:
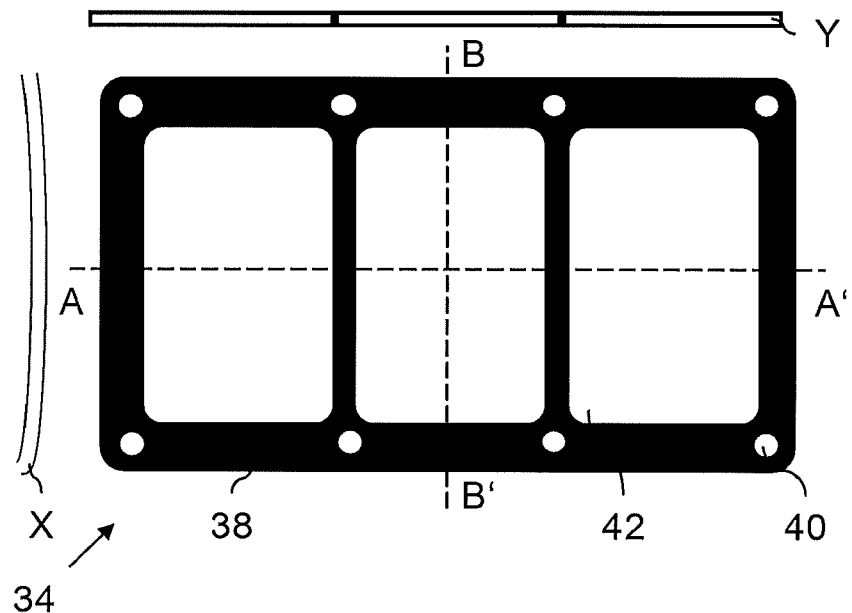
FIG. 2 shows a top view and a side view of a base plate according to a first exemplary embodiment of the disclosure.

An exemplary base plate 34 according to the disclosure is schematically shown in FIG. 2. The base plate 34 includes a matrix 38 which can be formed of metal. For example, the matrix 38 can be formed of aluminium. This metal can be ductile and can be deformed to get a close contact to the surface of the heat sink 36. However, the matrix 38 can be formed of any metal which is appropriate. For example, next to aluminium as such, alloys can be used which include aluminium as a component and especially as the main component thereof.

In order to improve the contact between the base plate 34 and the heat sink 36, the surface roughness of the base plate 34 can be configured to be as low as possible. Suitable exemplary values of the surface roughness lie in the exemplary range of <3 μm, for example, <2.3 μm. This can reduce the formation of cavities having a large volume and deteriorating the heat dissipation performance of the power module 10 between the base plate 34 and the heat sink 36.

In the matrix 38, through holes 40 can be provided for securing the base plate 34 to the heat sink 36. The through holes 40 can be formed in the matrix 38, or bulk material, respectively, because the reinforcements 42 can be hard to machine. The securing of the base plate 34 to the heat sink 36 can be realized, for example, by screws which are screwed in the heat sink 36, or by another connection which securely fixes the base plate 34 to the heat sink 36.

In order to enable heat dissipation, at least two reinforcements 42 can be arranged in the matrix 38. The reinforcements 42 are separated from each other in that they are positioned next to each other but arranged spaced apart. For example, the reinforcements 42 can be made of a ceramic compound, for example, silicon carbide (SiC) which provides thermal conductivity. Silicon carbide can allow the reinforcements 42 to have a good structural strength and furthermore to have good heat-dissipation properties.

A plurality of through holes 40 can be provided in the matrix 38 along the length as well as along the width of the base plate 34, wherein no reinforcement 42 is provided between the through holes 40 along the width of the base plate 34.

The exemplary embodiment of FIG. 2 can include, for example, three reinforcements 42. They can be embedded in the metal of the matrix 38 and can be completely covered by the metal, or matrix 38, respectively. In an example, the matrix 38 and thus the base plate 34 can have a dimension in the exemplary range of about (e.g., ±10%) 120 mm×160 mm to 170 mm×210 mm. In an example, the base plate 34 can be formed in an exemplary dimension of, for example, 137 mm×187 mm. Each reinforcement can be formed at least at exemplary dimensions of about 50 mm×100 mm, for example, 57 mm×104 mm.

In the according to FIG. 2, the reinforcements 42 can be fully embedded in the ductile material of the matrix 38, or the aluminium material, respectively. Additionally, the cavities, or pores, of the ceramic material of the reinforcements 42 can be completely filled with the material of the matrix 38, for example, aluminium, which can completely cover the reinforcements and all gaps there between.

The base plate 34 can fulfill different functions/requirements. It can conduct heat from the inside of the power module 10 to the environment. The base plate 34 thus can act as a heat spreader to conduct the heat over its surface to the heat sink 36. Therefore the thermal conductivity should be high (for example, >180 W/(mK) (20° C.)). This can be realized by forming the matrix 38 from aluminium and by using silicon carbide as material for the insert, or reinforcement 42, respectively.

In order to get a surface contact between the base plate 34 and the heat sink 36 as close as possible, the bottom side of the base plate 36 can be curved. This is apparent in the cross sectional view along the line B-B', which is defined by the reference sign X in FIG. 2. Due to the curved geometry of the base plate 34, or the formation of a bow, respectively, during the fixation to the heat sink 36, the base plate 34 is spanned to the heat sink 36 leading to an improved contact of the base plate 34 to the heat sink 36. However, according to the disclosure, it can be sufficient that the base plate 34 is only partly formed as a bow. This means that the curvature can be limited to a bow being formed over the width of the base plate 34, as seen from the cross-sectional view X of FIG. 1. In contrast, a curvature over the length of the base plate 34 may not be necessary, as seen from the cross-sectional view across the line A-A', which is defined by the reference sign Y in FIG. 1. However, it is possible to form the base plate 34 with a bow along the length of the base plate 34, for example along the full length, a half or along one third, according to the desired properties of the base plate 34. According to the disclosure, the width is the shorter side of the base plate with respect to its length.

Additionally, the maximum bow deflection height of the base plate 34 according to the disclosure can be, for example, 100 µm±50 µm.

A good flexural strength and fracture toughness can be useful to prevent cracking. The flexural strength of the base plate 34 can lie in the exemplary range of between about 300 MPa and 500 MPa, for example, 400 MPa. The fracture toughness can lie in the exemplary range of about 7 MPa m1/2 to 9 MPa m1/2, for example, 8.1 MPa m1/2.

An exemplary process of preparing a base plate 34 according to the disclosure can be as follows.

First, a ceramic preform, is produced. This can be realized, for example, by sintering, for example, a ceramic material, silicium carbide, having open pores, in particular in the form of a foam. In a further step, the prepared preform can be shaped, if desired. As an example, the preform can be stamped or machined to get the desired shape, or geometry, respectively. The shape of the preform can be, for example, rectangular or square. However, depending on the geometry of the heat sink 36, the reinforcements 42 can have any shape which may be positioned on the heat sink 36 such that the base plate 34 can be in close contact to the heat sink 36. After shaping the preform in the desired manner, at least two of the preforms can be placed in a form. Afterwards, liquid metal, for example, aluminium, is infiltrated in the form at a high temperature and at a high pressure, thereby filling the pores of the preform and the gaps between the composites. The content of silicium carbide with respect to the reinforcement 42 can be, for example, 62 vol %–28 vol % for desirable mechanical bulk properties. Additionally, the preforms can be fully covered by the metal.

The described process enables the reinforcements 42 to be embedded in the metallic material enabling the latter to form a matrix 38 in which the reinforcements 42 are arranged. Consequently, the matrix 38 can be formed by covering the preform with a metallic material, for example, aluminium.

With respect to the above, it is desirable to locate the reinforcements 42 such that the reinforcements 42 are arranged with a distance in the exemplary range of about 1 mm to 5 mm, for example, 3 mm. Such a distance between the reinforcements 42 is useful to provide a sufficient flexibility of the base plate 34. If the reinforcements 42 are positioned too close to each other, such flexibility can be prevented because of the stiffness and structural strength of the reinforcements 42. However, in order to get sufficient heat dissipation, the distance of the reinforcements 42 can be limited.

Additionally, if the reinforcements 42 are located with a distance between each other going below a certain level, the risk of cracks to be formed in the matrix material can occur due to the fact that the plastic deformation can exceed the potential of the matrix material. Thus the stress at the contact zone between the matrix 38 and the reinforcements 42 can be too high.

Figure 3:
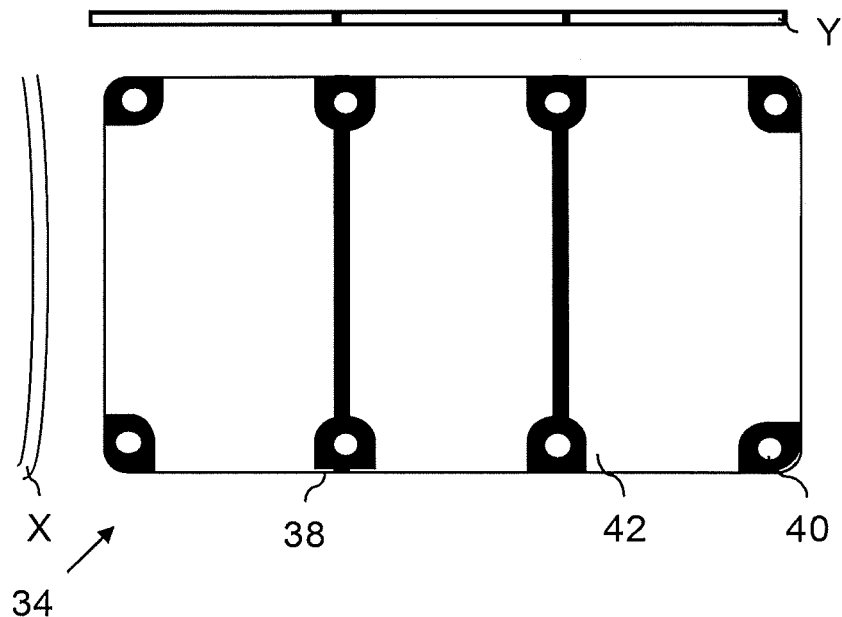
FIG. 3 shows a top view and a side view of a base plate according to an exemplary embodiment of the disclosure.

In FIG. 3, a further exemplary embodiment of a base plate 34 according to the disclosure is shown. According to FIG. 3, again, the base plate 34 can include three reinforcements 42. However, as seen, the reinforcements 42 can have a relatively bigger surface with respect to FIG. 2. According to FIG. 3, the matrix 38, or the metallic compound, respectively, is formed of a layer, or a coating of the metal provided on the reinforcements 42, thereby filling the gaps between the respective reinforcements 42. In this case the heat dissipation capacity can be greater with respect to FIG. 2.

Figure 4:
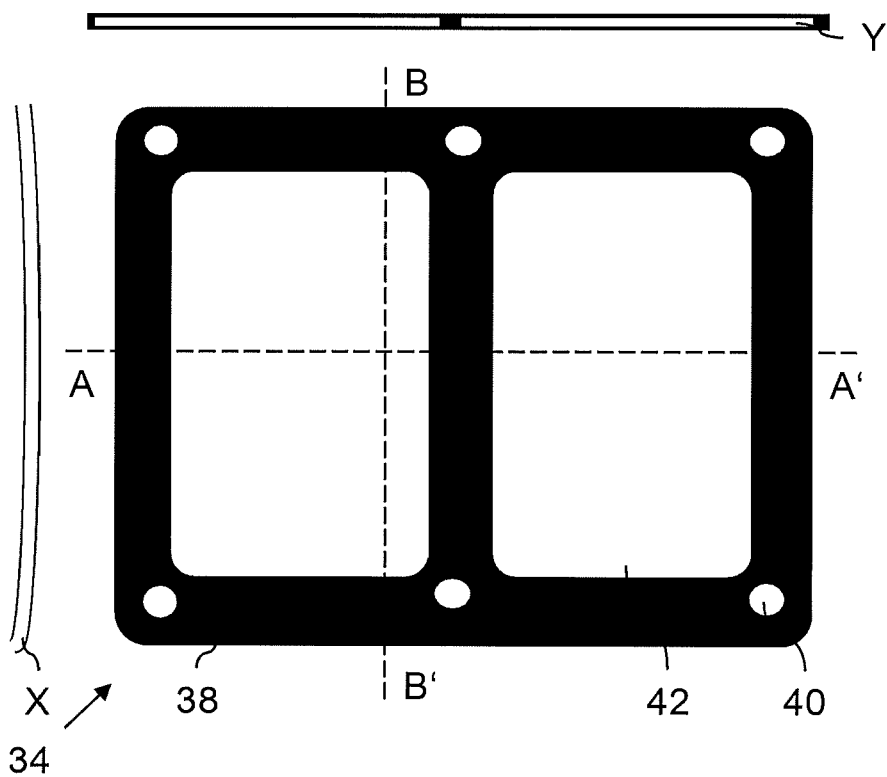
FIG. 4 shows a top view and a side view of a base plate according to an exemplary embodiment of the disclosure.

An exemplary embodiment of a base plate 34 according to the disclosure is shown in FIG. 4. The embodiment according to FIG. 4 generally corresponds to the embodiment of FIG. 2. However, according to FIG. 4, only two instead of three reinforcements 42 are present. In this embodiment, the base plate 34 as such may be relatively smaller leading so that it can be used in smaller power modules. By providing a continuous matrix 38 in which two separated reinforcements 42 are arranged, the base plate 34 can be flexible enough leading to contact between the base plate 34 and the surface of the heat sink 36. In a example of this embodiment, the matrix 38 and thus the base plate 34 can have a dimension in the exemplary range of about 120 mm×100 mm to 170 mm×150 mm. For example, the base plate 34 can be formed in an exemplary dimension of about 137 mm×127 mm. Each reinforcement 42 can be formed at least at exemplary dimensions of about 50 mm×100 mm, for example, 57 mm×104 mm.

Figure 5:
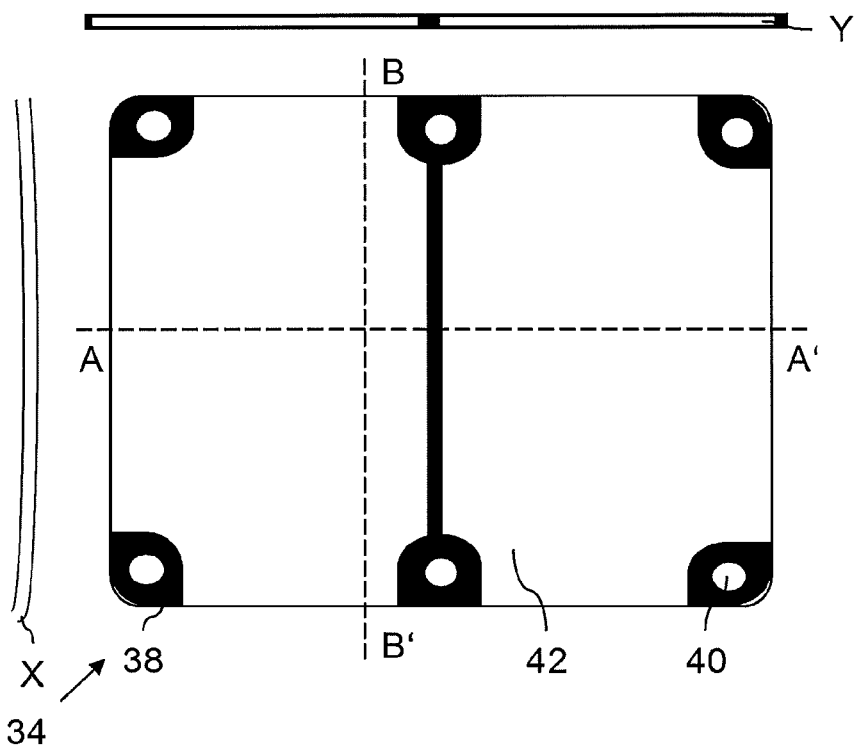
FIG. 5 shows a top view and a side view of a base plate according to an exemplary embodiment of the disclosure.

Shown in FIG. 5 is an exemplary embodiment of the disclosure relating to a base plate 34 including two reinforcements 42. In this embodiment, the base plate 34 is comparable to that of FIG. 3, for example, with respect to the size of the reinforcements 42.

Figure 6A:
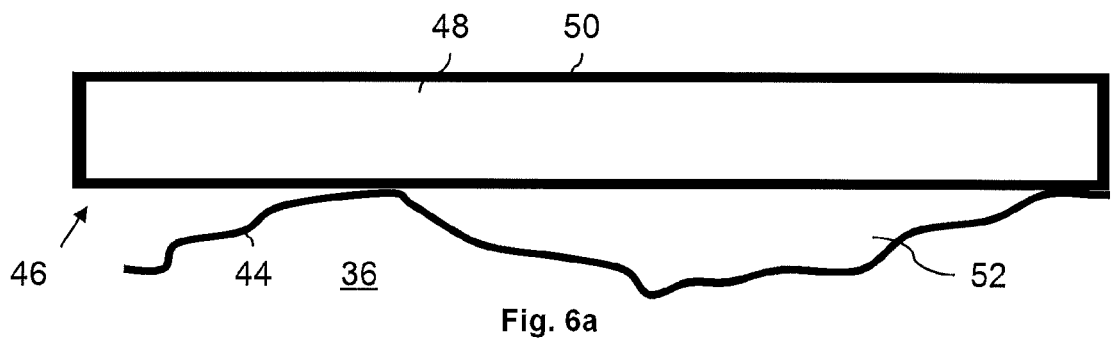
FIGS. 6a and 6b show a comparison of a contact between a known base plate and heat sink and an exemplary embodiment of a base plate and heat sink according to the disclosure.
Figure 6B:
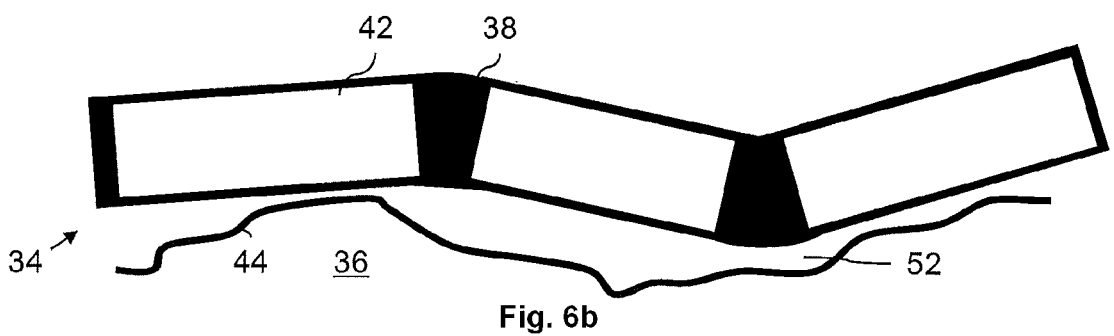

In FIGS. 6a and 6b, a comparison between the contacts of a known base plate 46 with the surface 44 of a heat sink 36 with respect to a contact between a base plate 34 according to the disclosure with the surface 44 of a heat sink 36 is schematically shown.

According to FIG. 6a, a known base plate 46 is shown, which is in contact with the surface 44 of a heat sink 36. The base plate 46 includes a reinforcement 48 which is covered by a metallic layer 50. The metallic layer 50 as well as the reinforcement 48 can be formed in a continuous way. Due to the roughness of the surface 44, cavities 52 are formed between the base plate 46 and the surface 44 of the heat sink 36. These cavities 52 can prevent a good heat flow between the base plate 46 and the heat sink 36 thereby deteriorating the heat dissipation properties.

According to FIG. 6b, a base plate 34 according to the disclosure is shown. The base plate 34 includes a continuous matrix 38 in which at least two, according to FIG. 6b, three separated and independent reinforcements 42 can be arranged. Due to the flexibility of the matrix 38, such as in the region of the gaps between the reinforcements 42, the base plate 34 has the ability to deform, or to bend, respectively and thus to adapt to the topography of the surface 44 of the heat sink 36. This can allow potentially present cavities 52 to be relatively smaller. Consequently, a much closer contact between the base plate 34 and the surface 50 can be reached. The heat dissipation properties can thus be improved.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE SIGNS LIST 10 power module
12 housing
14 semiconductor device
16 terminal
18 auxiliary terminal
20 aluminium bond wires
22 epoxy
24 substrate
26 metallization
28 solder 30 metallization
31 solder
32 insulating gel
34 base plate
35 heat conducting layer
36 heat sink
38 matrix
40 through holes
42 reinforcement
44 surface
46 base plate
48 reinforcement
50 metallic layer
52 cavity

What is claimed is:

1. A base plate for mounting on a heat sink of a power module, the baseplate comprising:
   a flexible, continuous matrix formed of metal; and
   at least two rigid reinforcements provided in the matrix adjacent to each other wherein the reinforcements are spaced apart from each other via portions of the matrix,
   wherein an area of the at least two reinforcements, the matrix is configured to independently react to a surface topology of the heat sink for close contact with the surface of the heat sink.

2. The base plate according to claim 1, comprising:
   a plurality of through holes for securing the base plate to a heat sink, the through holes being provided in the matrix along a length and a width of the base plate, wherein no reinforcements are provided between the through holes along the width of the base plate.

3. The base plate according to claim 1, wherein the at least two reinforcements are formed from silicium carbide.

4. The base plate according to claim 1, wherein the reinforcements are arranged with a distance from each other in a range of 1 mm to 5 mm.

5. The base plate according to claim 1, wherein the base plate is at least partly bowed.

6. The base plate according to claim 5, wherein a maximum bow deflection height is 100 μm±50 μm.

7. The base plate according to claim 5, wherein the base plate is bowed in a width direction.

8. The base plate according to claim 1, wherein all of the reinforcements together have a dimension of at least 70% of a total dimension of the base plate.

9. The base plate according to claim 1, wherein the matrix is a metal layer formed on and between the reinforcements.

10. The base plate according to claim 1, wherein a maximum value of a coefficient of thermal expansion of the base plate is in a range of 8-12 ppm/k.

11. The base plate according to claim 1, wherein the matrix comprises aluminium.

12. The base plate according to claim 2, wherein the at least two reinforcements are formed from silicium carbide.

13. The base plate according to claim 1, wherein the reinforcements are arranged with a distance from each other of about 3 mm.

14. The base plate according to claim 1, wherein all of the reinforcements together have a dimension of at least 85% of a total dimension of the base plate.

15. The base plate according to claim 1, wherein a maximum value of a coefficient of thermal expansion of the base plate is 10 ppm/k.

16. The base plate according to claim 8, wherein a maximum value of a coefficient of thermal expansion of the base plate is in a range of 8-12 ppm/k.

17. The base plate according to claim 16, wherein the matrix is formed as a metal layer formed on and between the reinforcements.

18. The base plate according to claim 17, in combination with:
   a heat sink; and
   a substrate having a semiconductor device.

19. The base plate according to claim 18, wherein the semiconductor device includes an insulated gate bipolar transistor (IGBT) of a power module.

20. The base plate according to claim 6, wherein a bow is formed only over the width of the base plate.

* * * * *